United States Patent [19]

Ong

[11] Patent Number: 4,858,179
[45] Date of Patent: Aug. 15, 1989

[54] APPARATUS FOR DETERMINING THE MINIMUM NUMBER OF STORAGE ELEMENTS REQUIRED TO STORE THE STATES OF A CIRCUIT

[75] Inventor: Shauchi Ong, Pleasantville, N.Y.

[73] Assignee: International Business Machines Corporation, Armonk, N.Y.

[21] Appl. No.: 798,198

[22] Filed: Nov. 14, 1985

[51] Int. Cl.$^4$ .......................... G06F 1/04; G06F 12/00
[52] U.S. Cl. .................... 364/900; 364/947.1; 364/967.4; 364/970.3; 364/970.4
[58] Field of Search ... 364/200 MS File, 900 MS File; 365/231, 200, 201; 307/480

[56] References Cited

U.S. PATENT DOCUMENTS

| | | | |
|---|---|---|---|
| 4,191,996 | 3/1980 | Chesley | 364/200 |
| 4,335,425 | 6/1982 | Goto et al. | 364/200 |
| 4,443,864 | 4/1984 | McElroy | 364/900 |
| 4,467,443 | 8/1984 | Shima | 364/900 |

*Primary Examiner*—Eddie P. Chan
*Assistant Examiner*—Christina M. Eakman
*Attorney, Agent, or Firm*—Thomas J. Kilgannon, Jr.

[57] ABSTRACT

This invention relates generally to techniques for designing electrical circuitry and more specifically relates to a method for determining the minimum number of storage elements required to store the states of circuit. This determination is achieved by combining the output states of a circuit which occur during a pair of adjacent clock intervals into a combined state occurring during a combined clock interval. The combining step is then repeated until all possible ones of the combined states have been obtained. Still more specifically, the method includes the step of generating, prior to the combining step, a waveform pattern showing the output states of the circuit. Once the minimum number of combined states is determined, the minimum number of storage elements required can be determined by invoking the equation: $m = \lceil \log_2 n \rceil$, wherein m is the number of storage elements or memory registers and n is the sum of all possible ones of the combined states. An improved clock circuit, with its associated combinatorial logic is also disclosed. The clock circuit, as a result of the above described method steps, requires fewer storage registers and less combinatorial logic.

18 Claims, 4 Drawing Sheets

APPARATUS FOR DETERMINING THE MINIMUM NUMBER OF STORAGE ELEMENTS REQUIRED TO STORE THE STATES OF A CIRCUIT

DESCRIPTION

Field of the Invention

This invention relates generally to techniques for designing electrical circuitry and more specifically relates to a method for determining the minimum number of storage elements required to store the states of circuit. This determination is achieved by combining the output states of a circuit which occur during a pair of adjacent clock intervals into a combined state occurring during a combined clock interval. The combining step is then repeated until all possible ones of the combined states have been obtained. Still more specifically, the method includes the step of generating, prior to the combining step, a waveform pattern showing the output states of the circuit. Once the minimum number of combined states is determined, the minimum number of storage elements required can be determined by invoking the equation: $m = \lceil \log_2 n \rceil$, wherein m is the number of storage elements or memory registers and n is the sum of all possible ones of the combined states. An improved clock circuit, with its associated combinatorial logic is also disclosed. The clock circuit, as a result of the above described method steps, requires fewer storage registers and less combinatorial logic. In addition, the improved clock circuit is further improved by preconditioning the output circuits so that "spikes" which might lead to spurious outputs do not occur.

BACKGROUND OF THE INVENTION

The prior art uses a method for determining the minimum number of storage registers required to store the minimum number of output states of a circuit. By considering each state of a circuit during each cycle of a clock, a so-called "state diagram" can be constructed which shows the minimum number of states required to provide a desired output. Then, using the equation $m = \lceil \log_2 n \rceil$ wherein m is the number of storage elements and n is the sum of all possible ones of the states, the minimum number of storage elements or memory registers can be determined. The prior art approach is described in detail in the books SWITCHING AND FINITE AUTOMATA THEORY by Z. Kohavi, McGraw-Hill, N. Y., 2nd edition and INTRODUCTION TO VLSI SYSTEMS by C. Mead and L. Conway, Addison-Wesley, Reading, MA, 1980.

In these references, the method of developing a circuit beginning with a waveform pattern is shown in detail. FIGS. 1 and 2 will be used hereinafter to show the prior art method of determining the minimum number of storage registers required to store the states of a clock circuit. Once the number of states is obtained by considering the state of the outputs during each clock cycle, the number of storage registers to store the states is easily determined. To the extent a master-slave storage arrangement is invoked to prevent the circuit from oscillating, the number of storage registers is doubled. Once the number of registers is determined, logical equations can be developed which determine the requirements of the combinatorial logic so the latter, based on its applied input signals, provides the proper input to the storage registers. FIG. 3 shows a clock circuit and its associated combinatorial logic which is developed in part from the "state diagram" of FIG. 2.

To the extent that output conditions during each clock cycle are considered, the prior art method provides the minimum number of states for that regime. However, by simply invoking another regime, that of combining the states occurring during at least a pair of adjacent clock intervals to produce a combined state occurring during a combined clock interval and repeating the combining step until all possible ones of the combined states have been obtained, the number of states can be reduced with a consequent reduction in the number of storage registers and associated combinatorial logic. In this new regime, when a master-slave arrangement is used to prevent circuit oscillation, the reduction obtained is doubled both with respect to the number of storage registers and combinatorial logic circuits.

It is, therefore, an object of the present invention to provide a method for determining the minimum number of states of a circuit using adjacent states of a clock, for example, such that the number of states is reduced and the number of memory units required to store such states is also reduced.

Another object is to provide a method for determining the minimum number of states of a circuit whereby the combinatorial logic requirements of the circuit are reduced.

Still another object is to provide a method for determining the minimum number of states of a circuit whereby the clock rate of a circuit or the storage unit complexity can be reduced.

Yet another object is to provide a clock circuit wherein the desired clock outputs are available using a smaller number of storage registers and less associated combinatorial logic circuitry.

Another object is to provide a clock circuit wherein spuriously occurring spikes and the resulting incorrect circuit operation are eliminated.

BRIEF SUMMARY OF THE INVENTION

The present invention relates to a method for determining the minimum number of states of a circuit which has an output state for each clock interval of a clocked input. From this, the minimum number of storage elements or memory registers necessary to store the output state may be determined. The method generally includes the step of combining the output states of the circuit which occur during at least a pair of adjacent clock intervals into a combined state occurring during a combined clock interval. This step is followed by repeating the combining step until all possible ones of the combined states have been obtained. Once the number of combined states is determined, the minimum number of storage registers is obtained. The remaining steps to obtain a circuit with the required outputs reside in the prior art.

To the extent the novel method of the present invention is utilized in conjunction with a clock circuit, a novel clock circuit is also disclosed which provides the same outputs as a prior art clock circuit but with a reduced number of storage registers and associated logic circuitry. In addition, a circuit feature is disclosed which permits the preconditioning of output logic circuits during one portion of a clock cycle so that "spikes" which result from two signals not being present simultaneously at a logic gate are eliminated.

These and other objects, features and advantages will become more apparent from the following more particular description of the preferred embodiments.

BRIEF DESCRIPTION OF THE DRAWINGS

FIG. 5 also includes a means for interconnecting the outputs of master storage registers to precondition certain of said output logic gates.

DESCRIPTION OF PREFERRED EMBODIMENTS

Before describing the preferred method step of the present invention, the prior art will be discussed briefly in conjunction with FIGS. 1 and 2.

Figure 3:
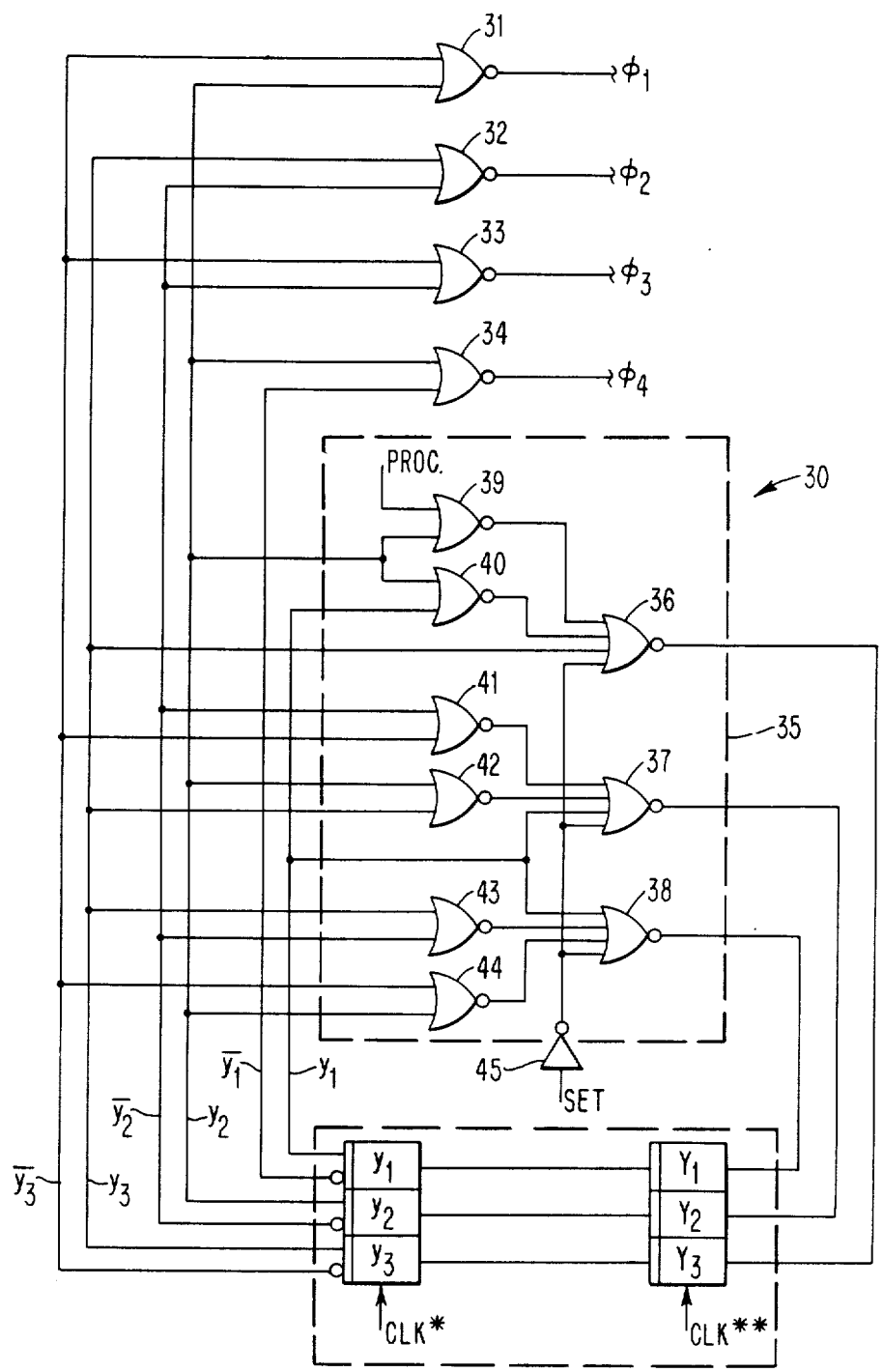
FIG. 3 is a schematic diagram of a clock circuit which is developed using the "state diagram" of FIG. 2 and other prior art steps.

A clock circuit with its associated storage registers, combinatorial logic and outputs will be briefly discussed in conjunction with the schematic diagram of FIG. 3 to clearly show the advantages obtained by using the novel method of the present invention.

Figure 1:
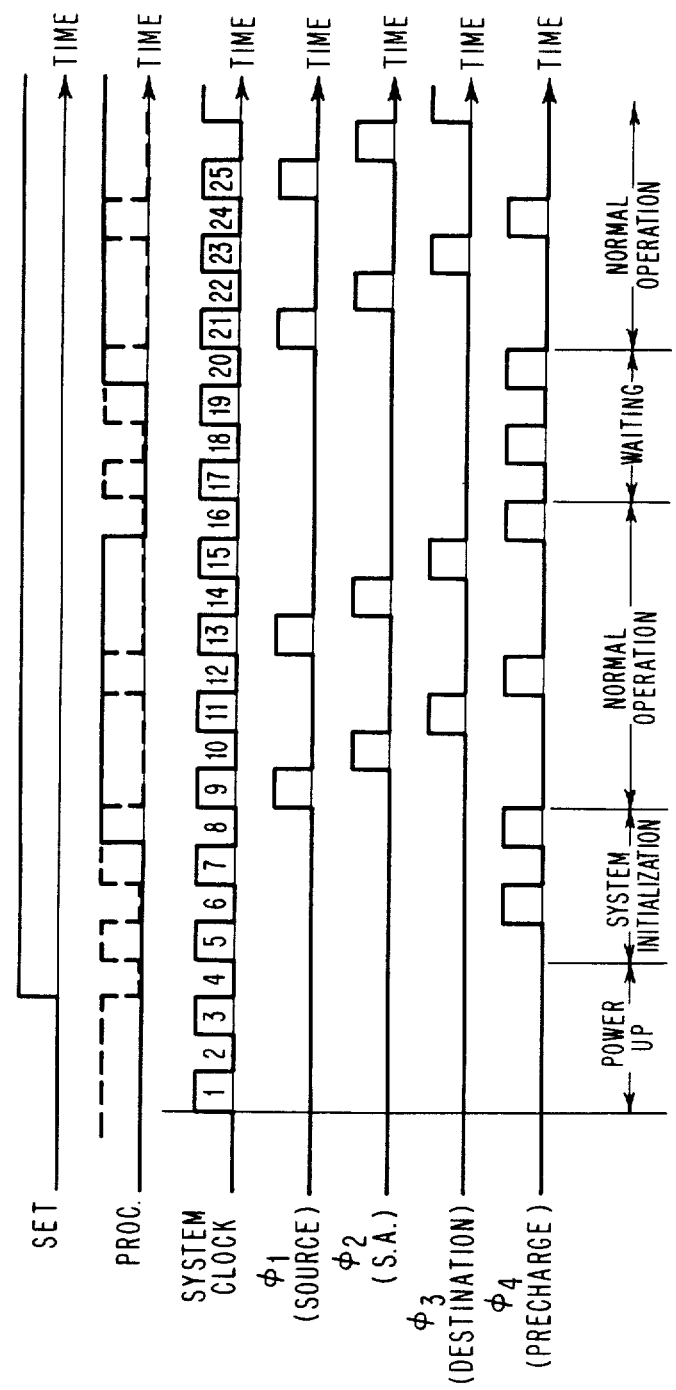
FIG. 1 is a waveform pattern showing the output states required of a circuit and their times of occurrence during repetitive clock cycles. Also shown are the times of occurrence of other input signals labeled SET and PROC in FIG. 1.

In FIG. 1, a waveform pattern is shown which includes a plurality of clock cycles 1-25 otherwise indicated in FIG. 1 as SYSTEM CLOCK. A plurality of output pulses are shown occurring at certain clock intervals and, based upon the circuit designer's requirements, four output phases, $\phi_1-\phi_4$ are needed. The output phases, $\phi_1-\phi_4$, are otherwise identified in FIG. 1 as SOURCE, S.A., DESTINATION and PRECHARGE, respectively. Also shown in FIG. 1 are a pair of input signals SET and PROC which are utilized to control the combinatorial logic of any resulting circuit which, in turn as will be seen hereinafter, controls the inputs to storage registers. While the circuit states can be determined from the output phases alone, it is important that the timing of the inputs SET and PROC be known since it is their condition which determines the change from one state to another.

The waveform pattern or clock phase diagram of FIG. 1 is developed from a set of specifications which, for example, requires that there be zero outputs from each of the four phases during the first five time intervals but that there be an output on the fourth phase during the sixth time interval. With inputs SET, $\overline{SET}$ and PROC, $\overline{PROC}$ available along with the clock pulses, discrete inputs have to be provided during a clock interval which provide the desired phase output during the next clock interval. Thus, in FIG. 1, during clock interval 1, if SET is low, none of the phases are actuated. Also, as long as SET remains low, none of the phases are actuated regardless of the condition of the clock CLK. However, if SET goes high, and CLK is high as shown during interval 5, an output is present on $\phi_4$ during interval 6. This output actuates a precharge function, for example, and is otherwise identified in FIG. 1 by the designation PRECHARGE. Considering now clock interval 6, SET is high and PROC and CLK are low. This condition provides no output on any of the phases during clock interval 7. Now, with SET and CLK both high during interval 7, an output on $\phi_4$ is provided during interval 8. During interval 8, SET and PROC are high but CLK is low. This discrete condition provides an output on $\phi_1$ which has the function of actuating inputs to a circuit which carries out some arithmetic or logic function, for example, during clock interval 9 and is otherwise identified in FIG. 1 as SOURCE. With SET and CLK high and PROC either high or low, during clock interval 9, an output is provided during clock interval 10 on $\phi_2$ which, for example, can be used to control the actuation of sense amplifiers and is otherwise identified in FIG. 1 by the designation S.A. During interval 10, with CLK low and SET high, PROC may be either high on low and an output is provided during the next interval 11 on $\phi_3$ which, for example, may control outputs from a circuit which carries out some arithmetic or logic function and is otherwise identified in FIG. 1 by the designation DESTINATION. With CLK and SET high and PROC high or low during clock interval 11, a $\phi_4$ output is provided during the next interval 12. To the extent it is desired to actuate outputs $\phi_1-\phi_4$ one after the other in the next four clock intervals 13-16, all that is required is that the conditions present during clock intervals 9-12 be duplicated. Thus, $\phi_1$ is activated during clock interval 13, $\phi_2$ during clock interval 14, $\phi_3$ during clock interval 15 and $\phi_4$ during clock interval 16. To change to another state, during clock interval 16, PROC goes low, CLK is low and SET is high, providing no outputs on any phase during clock interval 17. With SET high, CLK high and PROC either high or low during interval 17, an output is provided on $\phi_4$ during clock interval 18. Replicating the conditions of clock interval 16 during clock interval 18 provides no outputs on any of the phases during clock interval 19. Finally, providing the same conditions as prevailed during clock interval 17 for clock interval 19, a $\phi_4$ output is provided during clock interval 20. To the extent that the same outputs as those shown during NORMAL OPERATION period in FIG. 1 are to be provided again, CLK, SET and PROC should, during clock interval 20, replicate the conditions of clock interval 8 during which CLK is low and SET and PROC are high. At this point, it should be clear that to the extent the required outputs are regular or conform to some regular cycle, the desired outputs can be obtained by setting conditions of CLK, SET and PROC which are also regular. While the condition of CLK has been outlined for each clock interval, it should be appreciated that the $\phi_1-\phi_4$ outputs are determined on the basis of the conditions of the SET and PROC inputs.

Figure 2:
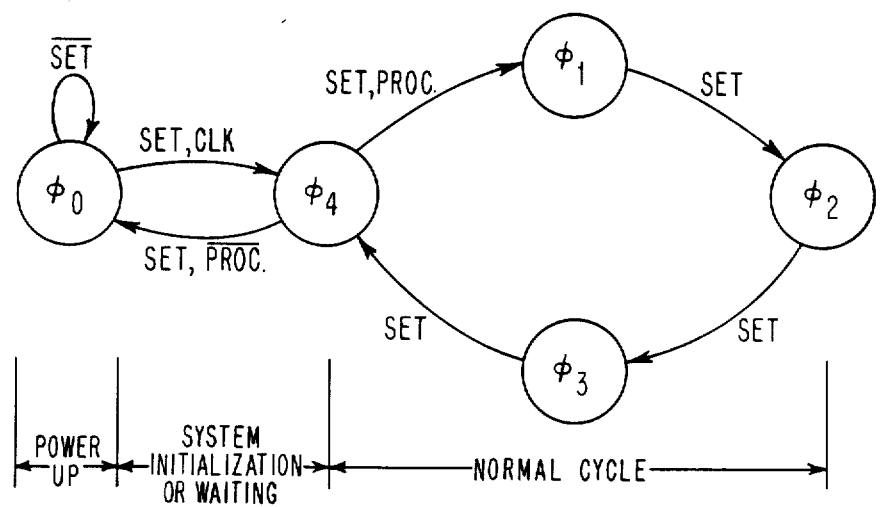
FIG. 2 is a prior art minimized "state diagram" which shows all the possible states when a state is obtained for each clock interval.

To the extent the foregoing description is contained in the pulse pattern of FIG. 1, it can be represented by the state diagram shown in FIG. 2. FIG. 2 is a prior art minimized "state diagram" which is obtained by considering each state output during each clock interval.

In FIG. 2, there is shown a plurality of circled states $\phi_0-\phi_4$ which show the output being provided when certain conditions of CLK, $\overline{CLK}$, SET, $\overline{SET}$ and PROC, $\overline{PROC}$ are invoked. Thus, circled $\phi_0$ - indicates that there are no outputs $\phi_1-\phi_4$ being provided as long as SET is low. This is represented by the arrow labeled $\overline{SET}$ extending from and returning to circled $\phi_0$. As long as SET is low, regardless of the condition of CLK and PROC, no outputs will be provided during any clock interval. However, if SET goes high and CLK is high, a new state is entered into and an output will be provided on $\phi_4$. This is the output shown at $\phi_4$ during clock interval 6 in FIG. 1. Note that during interval 5, SET is high, PROC is low or high and CLK is high. The arrow extending from circled $\phi_0$ to circled $\phi_4$ in FIG. 2 and labeled SET, CLK shows the transition from $\phi_0$ to $\phi_4$. If no further outputs are required, the output $\phi$ can be obtained by applying the condition SET high, PROC low and CLK low. This is shown in FIG. 2, by the arrow labeled SET, $\overline{PROC}$ extending from circled $\phi_4$ to circled $\phi_0$ and is represented in FIG. 1 by the conditions shown during clock interval 6.

On the other hand, if other outputs are desired at the other phases, with the state being such that an output is being provided at circled $\phi_4$ in FIG. 2, if the conditions SET and PROC high and CLK low are met, the state of the output will change from circled $\phi_4$ to circled $\phi_1$ in FIG. 2 during the next clock interval. This is shown in FIG. 2 by the arrow labeled SET, PROC extending from circled $\phi_4$ to circled $\phi_1$. These conditions are shown in FIG. 1 as occurring during clock interval 8.

To proceed to another state such as providing an output on $\phi_2$, the conditions SET and CLK are high and PROC is either high or low causing the state to change from circled $\phi_1$ in FIG. 2 to circled $\phi_2$. The arrow labeled SET extending from circled $\phi_1$ to circled $\phi_2$ in FIG. 2 shows the transition. The conditions are shown occurring during clock interval 9 in FIG. 1.

Arrows labeled SET extending between circled $\phi_2$ and $\phi_3$ and between circled $\phi_3$ and circled $\phi_4$, complete the state diagram of FIG. 2. The conditions replicating the condition of clock interval 9 during clock intervals 10 and 11, respectively, change the state from circled 2 to circled $\phi_3$ and from circled $\phi_3$ to circled $\phi_4$, respectively.

Based on the above description, it should be clear that the states $\phi_1$, $\phi_2$, $\phi_3$, and $\phi_4$ can be obtained by providing the proper conditions and that the $\phi_0$ state can be attained by invoking other appropriate conditions. For example, once the $\phi_4$ state is attained, the state can be changed to $\phi_1$ by applying SET, PROC high or the state can be changed to $\phi_0$ by applying SET high and PROC low.

Note in FIGS. 1 and 2, that the functions POWER UP, SYSTEM INITIALIZATION, etc. are shown in both FIGS. so that the time sequence of the occurrence of the various pulses which actuate the functions can be related to what states are present during what function.

The following TABLE I shows another representation of the state diagram of FIG. 2.

TABLE I in the leftmost column shows each of the possible present states of a desired output. The next four columns show the state of an output during a succeeding clock interval when the conditions indicated at the top of each of the four columns are invoked.

TABLE I

| Present State | SET = 0<br>PROC = 0 | SET = 0<br>PROC = 1 | SET = 1<br>PROC = 0 | Set = 1<br>PROC = 1 |
|---|---|---|---|---|
| $\phi_0$ | $\phi_0$ | $\phi_0$ | $\phi_4$ | $\phi_4$ |
| $\phi_1$ | $\phi_0$ | $\phi_0$ | $\phi_2$ | $\phi_2$ |
| $\phi_2$ | $\phi_0$ | $\phi_0$ | $\phi_3$ | $\phi_3$ |
| $\phi_3$ | $\phi_0$ | $\phi_0$ | $\phi_4$ | $\phi_4$ |

TABLE I-continued

| Present State | SET = 0<br>PROC = 0 | SET = 0<br>PROC = 1 | SET = 1<br>PROC = 0 | Set = 1<br>PROC = 1 |
|---|---|---|---|---|
| $\phi_4$ | $\phi_0$ | $\phi_0$ | $\phi_0$ | $\phi_1$ |

As has been indicated above, the state diagram of FIG. 2 has been generated using each state in the manner of the prior art to determine the minimum number of states required for a clock circuit operating in conjunction with the inputs CLK, SET and PROC as shown in FIG. 1. Since the minimal number of states is five ($\phi_0-\phi_4$), the minimal number of memory units to store these states may be determined pursuant to the known relationship:

$$m = \lceil \log_2 n \rceil$$

where:
  m = the number of storage registers
  n = the number of states.
Thus, $$m = \lceil \log_2 5 = 3 \rceil$$

The three storage registers, ($Y_1$, $Y_2$, $Y_3$) must have a unique state to insure that a discrete output representative of that unique state is provided. Table II shows five-out-of-eight unique possible CODE for storage registers $Y_1$, $Y_2$, $Y_3$. Each unique condition is associated with one of the states $\phi_0-\phi_4$.

TABLE II

| STATE | REGISTER | | |
|---|---|---|---|
| | $y_1$ | $y_2$ | $y_3$ |
| $\phi_0$ | 0 | 0 | 0 |
| $\phi_1$ | 0 | 0 | 1 |
| $\phi_2$ | 0 | 1 | 0 |
| $\phi_3$ | 0 | 1 | 1 |
| $\phi_4$ | 1 | 0 | 0 |

TABLE III below shows the outputs of registers $Y_1-Y_3$ mapped onto the state representations of TABLE I. Thus, where a given state $\phi_0$ for example, appears in TABLE I, the coded output for that state (000) is substituted everywhere it appears resulting in the following TABLE II.

TABLE III

| Present State | SET = 0<br>PROC = 0 | | SET = 0<br>PROC = 1 | | SET = 1<br>PROC = 0 | | SET = 1<br>PROC = 1 | |
|---|---|---|---|---|---|---|---|---|
| $\phi_0$ 000 | $\phi_0$ | 000 | $\phi_0$ | 000 | $\phi_4$ | 100 | $\phi_4$ | 100 |
| $\phi_1$ 001 | $\phi_0$ | 000 | $\phi_0$ | 000 | $\phi_2$ | 010 | $\phi_2$ | 010 |
| $\phi_2$ 010 | $\phi_0$ | 000 | $\phi_0$ | 000 | $\phi_3$ | 011 | $\phi_3$ | 011 |
| $\phi_3$ 011 | $\phi_0$ | 000 | $\phi_0$ | 000 | $\phi_4$ | 100 | $\phi_4$ | 100 |
| $\phi_4$ 100 | $\phi_0$ | 000 | $\phi_0$ | 000 | $\phi_0$ | 000 | $\phi_1$ | 001 |

Once the coded outputs of TABLE III are obtained, a technique called Karnaugh mapping is invoked to provide a logic translation of the information shown in TABLE III. The Karnaugh mapping technique is described in detail in the book entitled SWITCHING AND FINITE AUTOMATA THEORY by Z. Kohavi, McGraw-Hill, N.Y., 2nd edition.

Since this technique is well-known to circuit designers, suffice it to say that logical equations which show the inputs to a plurality of NOR gates can be developed. In the present situation, since a master-slave relationship is envisaged for storing the circuit states, the slave storage registers will provide the desired inputs to the NOR gates of which there are four; one for each phase, $\phi_1-\phi_4$. The slave registers are identified as $y_1$, $y_2$, $y_3$ and provide true and complement outputs of inputs which are gated into them from associated master registers, $Y_1$, $Y_2$, $Y_3$. The following TABLE IV shows the outputs from slave registers $y_1$, $y_2$, $y_3$ which provide outputs on the $\phi_1-\phi_4$ output NOR gates.

TABLE IV

| | | | | |
|---|---|---|---|---|
| $\phi_1$ | = | $\overline{y_2} \; y_3$ | = | $\overline{\overline{y_2} + y_3}$ |
| $\phi_2$ | = | $y_2 \; \overline{y_3}$ | = | $\overline{y_2 + \overline{y_3}}$ |
| $\phi_3$ | = | $y_2 \; y_3$ | = | $\overline{\overline{y_2} + \overline{y_3}}$ |
| $\phi_4$ | = | $y_1 \; \overline{y_2}$ | = | $\overline{\overline{y_1} + y_2}$ |

Using the same Karnaugh mapping techniques, the outputs of the combinatorial logic NOR gates which are the inputs to the master storage registers $Y_1$, $Y_2$, $Y_3$ can be determined. The following TABLE V shows the relevant logic equations. The inputs to the storage registers $Y_1$, $Y_2$, $Y_3$ are based upon the outputs $y_1$, $y_2$, $y_3$ from the slave storage registers during the preceding clock interval.

TABLE V

| | | |
|---|---|---|
| $Y_1$ | = | SET $\cdot \overline{y_1} \cdot (\overline{y_2} + y_3) \cdot (y_2 + \overline{y_3})$ |
| $Y_2$ | = | SET $\cdot \overline{y_1} \cdot (\overline{y_2} + \overline{y_3}) \cdot (y_2 + y_3)$ |
| $Y_3$ | = | SET $\cdot \overline{y_3} \cdot (y_1 + y_2) \cdot (y_2 + \text{PROC})$ |

Based on the above equations, certain conclusions can be made which lead to a circuit which provides the desired outputs on both the $\phi_1-\phi_4$ NOR gates and the combinatorial logic NOR gates which provide inputs to the master storage registers $Y_1$, $Y_2$, $Y_3$. One such conclusion is that if SET is zero, regardless of the condition of other inputs, the values of $Y_1$, $Y_2$, $Y_3$ will always be zero. To obtain a possibility for a one output, SET must always be one.

Based on all the foregoing, the circuit of FIG. 3 is developed which provides the proper outputs on $\phi_1-\phi_4$ and the proper inputs from a combinatorial logic circuit to master storage registers based on inputs from slave storage registers during the preceding clock interval. The schematic diagram of FIG. 3 shows a clock circuit 30 which includes a plurality of output NOR gates 31-34 which provide at their outputs signals $\phi_1-\phi_4$, respectively. Also shown is a combinatorial logic circuit 35 which includes three logic NOR gates 36-38; the outputs of which are connected to the inputs of master storage registers $Y_1-Y_3$, respectively. Circuit 35 further includes a pair of input NOR gates 39,40 connected to NOR gate 36; a pair of input NOR gates 41-42 connected to NOR gate 37 and another pair of input NOR gates 43,44 connected to NOR gate 38. An inverter 45 connected to a pulsed source identified in FIG. 3 as SET has its output connected to an input of each of the logic NOR gates 36-38.

In FIG. 3, the master storage registers $Y_1-Y_3$ are connected to the inputs of slave storage registers $y_1-y_3$. The later provide true and complement versions of their inputs at respective true and complement output terminals. The interconnection lines from each of these outputs have been identified in FIG. 3 as $y_1$, $\overline{y_1}$, $y_2$, $\overline{y_2}$, $y_3$, $\overline{y_3}$. In this way, the presence or absence of a signal on any NOR gate can be determined depending on what the input is at slave register $y_1-y_3$. Thus, if the input to storage register $y_1$ is 1, the true output is 1 and the complement output is 0. In FIG. 3, the interconnection line $y_1$, is connected to logic NOR gates 37,38 and to input NOR gate 40 and interconnection line $\overline{y_1}$ is connected to output NOR gate 34. The true output ($y_2$) of storage register $y_2$ is connected to input NOR gates 39, 40, 42 and 44 and to output NOR gates 31,34. The complement output ($\overline{y_2}$) of register $y_2$ is connected to input NOR gates 41,43, and to output NOR gates 32,33. The true output ($y_3$) of register $y_3$ is connected to input NOR gates 42,43 to logic NOR gate 36 and to output NOR gate 32. The complement output ($\overline{y_3}$) of register $y_3$ is connected to input NOR gates 41,44 and to output NOR gates 31,33. In FIG. 3, input NOR gate 39 is connected to a pulsed source identified as PROC in FIG. 3 and master and slave storage registers $Y_1-Y_3$ and $y_1-y_3$ are connected to sources of clock pulses identified as CLK* and CLK** in FIG. 3.

In operation, the circuit of FIG. 3 provides the outputs $\phi_1-\phi_4$ at the appropriate time interval in response to inputs which appear at the inputs of slave storage registers $y_1-y_3$. The inputs of slave storage registers $y_1-y_3$ are obtained as outputs from master storage registers $Y_1-Y_3$ which receive such inputs as outputs from logic NOR gates 36-38. As previously indicated, if pulsed source SET is zero, the outputs of logic NOR gates 36-38 are always zero. However, with SET at one, the possibility for an output other than zero is present and is a function of the outputs provided at slave storage registers $y_1-y_3$. Table II shows the coded inputs to registers $y_1-y_3$. Thus, an output of 000 from registers $y_1-y_3$, respectively, provide zero outputs on all the phases. If an output is desired on $\phi_3$, the inputs to registers $y_1-y_3$ are 011, respectively. Similarly, inputs 100 to registers $y_1-y_3$, respectively, provides an output on $\phi_4$. To the extent that the inputs to slave registers $y_1-y_3$ are obtained from master storage registers $Y_1-Y_3$, it should be appreciated that the inputs to the latter are obtained from combinatorial logic circuit 35 at the outputs of NOR logic gates 36-38. Thus, when the inputs to slave registers $y_1-y_3$ are latched in under control of a clock signal, CLK* (which may be different from the system clock, CLK, referred to hereinabove), the appropriate output at output NOR gates 31-34 is obtained and simultaneously, outputs on logic NOR gates 36-38 are obtained which are inputs to master registers $Y_1-Y_3$. These inputs are latched-in during a subsequent cycle of the clock, CLK** (which is a delayed version of CLK*), and a new set of inputs are provided to slave registers for latching-in on the next cycle of CLK*. Using the equations of TABLE V, the inputs to master registers $Y_1-Y_3$ are based upon the conditions of the slave registers and the values of SET and PROC. These outputs are the inputs presented to the slave registers $y_1-y_3$ during the next clock cycle.

Figure 4:
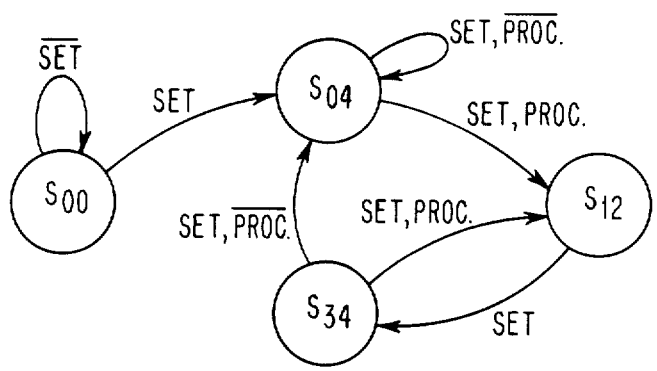
FIG. 4 is a "state diagram" which shows all the possible combined states when a combined state is obtained for at least a pair of adjacent clock intervals (combined clock interval).
Figure 5:
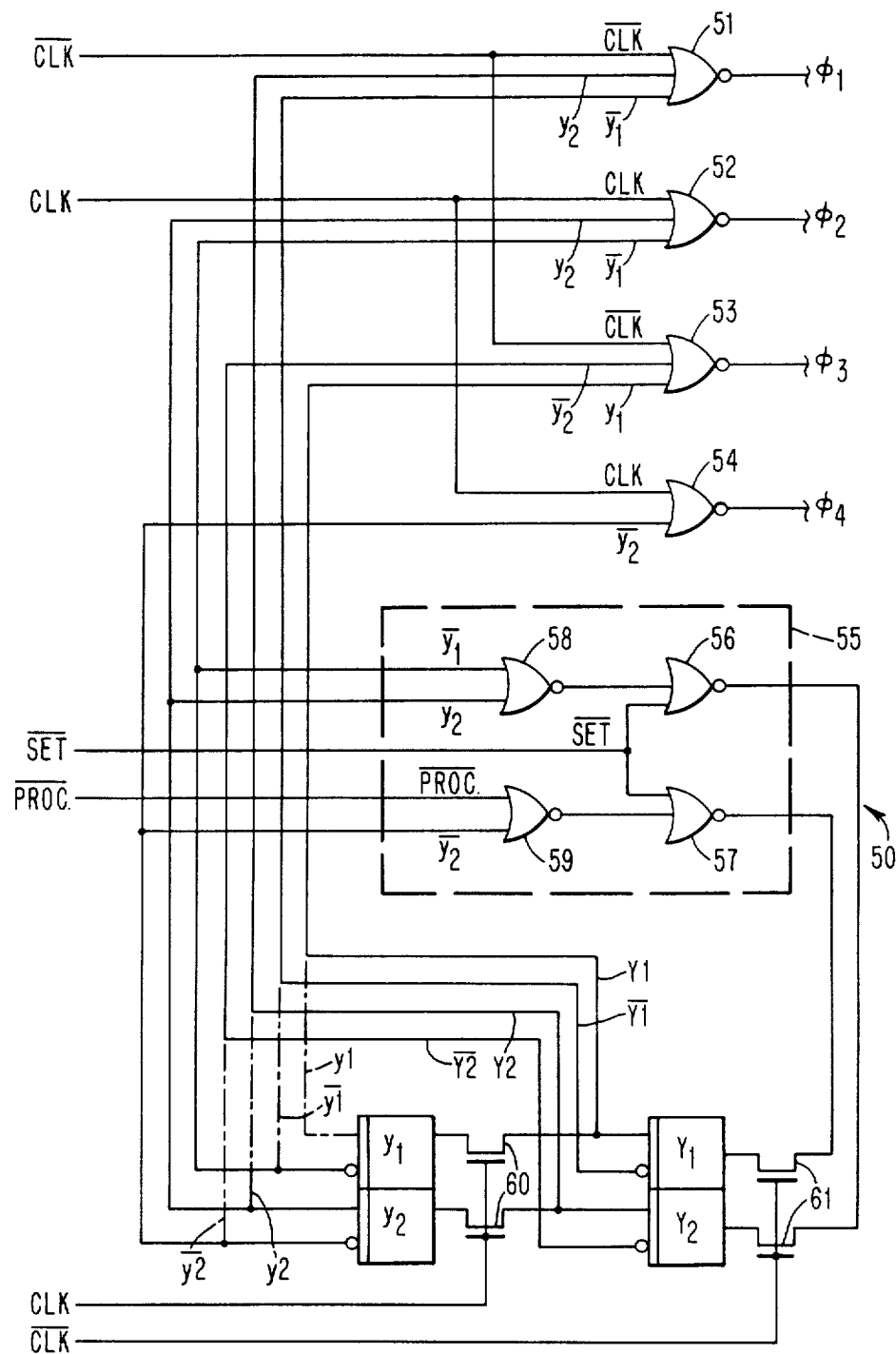
FIG. 5 is a schematic diagram of a novel clock circuit which is developed using the "state diagram" of FIG. 4 and certain prior art steps. The resulting circuit has fewer storage registers and combinatorial logic circuits than the circuit of FIG. 3.

The foregoing presentation of the prior art method of designing circuits using each state of the circuit has been made so that a direct comparison can be made between the state diagrams of FIGS. 2 and 4 and between the circuits of FIGS. 3 and 5. As will be seen in what follows, the method of the present invention of using adjacent states of a circuit provides for the generation of a "state diagram" having fewer states than the prior art and results in a circuit which provides the same outputs but with fewer storage registers, less combinatorial logic and less interconnections. Returning now to FIG. 1, the states of a circuit can now be obtained by using the states of the circuit during adjacent or combined clock intervals. As previously indicated, the waveforms of FIG. 1 are based on the specifications of a circuit designer and indicate what outputs are required during what clock intervals as a function of inputs SET and PROC.

Now, using clock intervals 1 and 2, when all the outputs $\phi_1-\phi_4$ are intended to be zero, the state of the circuit may be characterized as the $S_{00}$ state and is so indicated by the circled $S_{00}$ in the "state diagram" of FIG. 4. Then, as long as the value of SET is zero during any clock interval, the state of the circuit will return to circled $S_{00}$ state in FIG. 4. This is shown in FIG. 4 by the arrow labeled $\overline{SET}$ extending from and returning to circled $S_{00}$. Thus, the circuit remains in the $S_{00}$ state during clock intervals 3,4. When a SET input is applied, the circuit, during clock intervals 5,6, provide all zero outputs during clock interval 5 and a $\phi_4$ output during clock interval 6. This condition represents a new circuit state during a combined clock interval of $S_{04}$. This state is shown in FIG. 4 as circled $S_{04}$ and occurs upon the application of a SET signal. This is shown in FIG. 4 by the arrow labeled SET extending from circled $S_{00}$ to circled $S_{04}$ in FIG. 4.

Considering now the combined clock intervals 7 and 8, it is seen that as long as the inputs SET and $\overline{PROC}$ are applied, the circuit will provide all zero outputs during the first portion of the combined clock interval, interval 7, and a $\phi_4$ output during the second portion of the 30 combined clock interval, interval 8. This is shown in FIG. 4 by the arrow labeled SET, $\overline{PROC}$ extending from and returning to circled $S_{04}$.

In the next combined clock interval, 9,10, outputs are specified in FIG. 1 as being required at outputs $\phi_1$ and $\phi_2$. This represents a new state $S_{12}$ and occurs when input signals SET and PROC are present. The new state is shown in FIG. 4 as circled $S_{12}$ and the input signals are represented by the arrow labeled SET, PROC extending from circled $S_{04}$ to circled $S_{12}$ in FIG. 4. It should be noted in FIG. 1 that the input required to cause a particular output during a given clock interval is always present during the preceding clock interval.

During combined clock intervals 11,12, new output states are entered into which have outputs $\phi_3$ and $\phi_4$ during the respective clock intervals. FIG. 1 shows that the combined state is achieved by applying the input SET during the combined clock interval. The new state is shown in FIG. 4 as circled $S_{34}$ and the input signal is shown by the arrow labeled SET extending from circled $S_{12}$ to circled $S_{34}$. To the extent that FIG. 1 requires outputs $\phi_1,\phi_2$ during the combined clock interval 13,14 and output $\phi_3,\phi_4$ during the combined clock interval 15,16, the circuit must repeat the states $S_{12}$ and $S_{34}$. This repetition is shown in FIG. 4, by the arrow labeled SET, PROC extending between circled $S_{34}$ *1 and circled* $S_{12}$ *1 and the arrow labeled SET extending between circled S12* and circled $S_{34}$.

FIG. 1 now requires, during the next combined clock interval, that no outputs be present during clock interval 17 and that the $\phi_4$ output be present during clock interval 18. The state of the circuit during the combined clock interval is shown in FIG. 4 as already present circled $S_{04}$ and inputs SET, $\overline{PROC}$ are required for the circuit to assume the $S_{04}$ state. The input conditions are shown in FIG. 4 by the arrow labeled SET, $\overline{PROC}$ extending between circled $S_{34}$ and circled $S_{04}$. To the extent that the output requirements during succeeding clock intervals are repetitive, it can be seen that all possible circuit states have been accounted for and that the "state diagram" of FIG. 4 shows all the possible circuit states.

Now in a manner similar to that used in connection with the "state diagram" of FIG. 2, the number of storage elements or registers required to store the circuit states can be determined from the relationship $$m = \lceil \log_2 n \rceil$$

where:

m = number of storage registers
n = sum of all possible ones of the combined states.

Thus, noting the four possible states of the "state diagram" of FIG. 4, the relationship $$m = \lceil \log_2 4 \rceil = 2$$

is obtained.

Based on the above result, it can be immediately seen that the number of storage elements or registers required using adjacent states during combined clock intervals is reduced from three to two. In the master-slave environment utilized in connection with FIG. 3, the number of storage registers is reduced from six to four. As will be seen in what follows, the resulting circuit will require only two output logic NOR gates resulting in a reduction in the complexity of the combinatorial logic circuit and its associated interconnections.

Once this point has been reached, the same prior art techniques used to obtain the circuit of FIG. 3 can be invoked to obtain the circuit of FIG. 5. Using these techniques, as described in detail in the previously mentioned book SWITCHING AND FINITE AUTOMATA THEORY, the following TABLE VI shows the outputs from slave registers $y_1,y_2$ which provide outputs on the $\phi_1-\phi_4$ output NOR gates of FIG. 5.

TABLE VI

| | | | | |
|---|---|---|---|---|
| $\phi_1$ | = | $\overline{\overline{y_1} + y_2 + \overline{CLK}}$ | = | $\overline{Y_1 + Y_2 + \overline{CLK}}$ |
| $\phi_2$ | = | $\overline{y_1 + y_2 + CLK}$ | | |
| $\phi_3$ | = | $\overline{y_1 + \overline{y_2} + \overline{CLK}}$ | = | $\overline{Y_1 + \overline{Y_2} + \overline{CLK}}$ |
| $\phi_4$ | = | $\overline{y_2 + \overline{CLK}}$ | | |

The inputs to storage registers $Y_1$, $Y_2$ are based upon the outputs $y_1,y_2$ from the slave storage register during the preceding clock interval. The following TABLE VII shows the relevant logic equations.

TABLE VII

| | | |
|---|---|---|
| $Y_1$ | = | $SET \cdot (y_1 + y_2)$ |
| $Y_2$ | = | $SET \cdot (y_2 + \overline{PROC})$ |

Then based upon the foregoing logic equations, the circuit of FIG. 5 can be developed.

Referring now to FIG. 5, there is shown a schematic diagram of a circuit developed from the information contained in FIGS. 1 and 4. Clock circuit 50 includes a plurality of output NOR gates 51–54 which provide at their outputs, the output signals $\phi_1-\phi_4$, respectively. Also shown is a combinatorial logic circuit 55 which includes two logic NOR gates 56,57; the outputs of which are connected to the inputs of master storage registers $Y_1, Y_2$, respectively. Circuit 55 further includes an input NOR gate 58, the output of which is connected to logic NOR gate 56 and another input NOR gate 59, the output of which is connected to logic NOR gate 57.

In FIG. 5, the master storage registers $Y_1, Y_2$ are connected to the inputs of slave storage registers $y_1, y_2$, respectively, by a pair of switchable FET's 60 the gates of which are connected to a pulsed source, CLK, of clock signals. Slave storage registers $y_1, y_2$ provide true and complement versions of their inputs at respective true and complement output terminals. The interconnection lines (some of which are shown as dashed lines) from each of these outputs have been identified in FIG. 5 as $y_1, \bar{y}_1$ and $y_2, \bar{y}_2$. In FIG. 5, the true output ($y_1$) of storage register $y_1$ is connected to the input of output NOR gate 53. The complement output ($\bar{y}_1$)of storage register $y_1$ is connected to the inputs of output NOR gates 51,52 and input NOR gate 58. Similarly, the true output ($y_2$) of storage register $y_2$ is connected to the inputs of output NOR gates 51,52 and input NOR gate 58. The complement output ($\bar{y}_2$) of storage register $y_2$ is connected to the inputs of output NOR gates 53,54 and input NOR gate 59. Clock pulses indicated in FIG. 5 as CLK are applied to the inputs of output NOR gates 52,54 while the signal $\overline{CLK}$ is connected to the inputs of output NOR gates 51,53. Input signal $\overline{SET}$ is shown in FIG. 5 connected to the inputs of logic NOR gates 56,57 while another input signal $\overline{PROC}$ is shown in FIG. 5 connected to the input of input logic NOR gate 59. In FIG. 5, the outputs of logic NOR gates 56,57 are connected via switchable FET devices 61 to the inputs of master storage registers $Y_1, Y_2$, respectively. Devices 61 are actuated simultaneously by the application of a clock signal to their gates. This is shown as a source $\overline{CLK}$ in FIG. 5. Thus, when $\overline{CLK}$ is applied to devices 61, the outputs of logic NOR gates 57, 56 are latched into registers $Y_1, Y_2$, respectively. Similarly, when a clock signal, CLK, is applied to the gates of device 60, the true outputs only of storage registers $Y_1, Y_2$ are applied to the inputs of slave storage registers $y_1, y_2$. In FIG. 5, a plurality of lines labeled Y1, $\overline{Y1}$, Y2 and $\overline{Y2}$ are shown as interconnections bypassing slave storage registers $y_1, y_2$. The interconnections are shown extending from the true and complement outputs of master storage registers $Y_1, Y_2$ to connect up with the true and complement output interconnections of the slave storage registers $y_1, y_2$, respectively. The bypass interconnections Y1, $\overline{Y1}$, Y2 and $\overline{Y2}$ are used to provide signals which may be undergoing transitions during a clock interval when the NOR gate to which such signals are applied is effectively disabled by having a high clock signal applied as another input. When these interconnection lines ar used, dashed line interconnections y1, $\bar{y}1$, y2 and $\bar{y}2$ are removed. Using this approach which will be described in more detail hereinafter, spurious outputs on NOR gates 51-54 are eliminated.

Since there are only two storage registers required, the coding for the states $S_{00}-S_{34}$ may be as shown in the following TABLE VIII.

TABLE VIII

|   |   | y1y2 |
|---|---|------|
| $S_{00}$ | = | 00 |
| $S_{04}$ | = | 11 |
| $S_{12}$ | = | 10 |

TABLE VIII-continued

| $S_{34}$ | = | 01 |
|---|---|---|

The coding shown represents an input from the master storage registers which provides at most one of the outputs $\phi_1-\phi_4$ during a single clock interval. To the extent that the circuit states are combined as shown in FIG. 4, it should be appreciated that the same coding which produces one output during the first portion of a combined clock interval may produce a different output during the second portion of a combined clock interval. This will become apparent from a more detailed consideration of the operation of the circuit of FIG. 5 in what follows.

In the circuit of FIG. 5 assume that the inputs to slave storage registers $y_1, y_2$ are 00, respectively. Under such circumstances, the outputs $\phi_1-\phi_4$ are zero and the circuit is said to be in the state $S_{00}$. At the same time, as long as $\overline{SET}$ high is applied to combinatorial logic circuit 55, circuit 50 will remain in the $S_{00}$ state. However, once a SET high ($\overline{SET}$ low) input is applied with zero inputs at the inputs of storage registers $y_1, y_2$, the circuit assumes the $S_{04}$ state meaning that a zero output is obtained during the first portion of a combined clock interval on all the outputs $\phi_1-\phi_4$ and a one output is obtained on the $\phi_4$ output during the second portion of a combined clock interval.

A representative sequence using FIGS. 1, 4 and 5 is outlined in what follows. In the discussion, interconnections y1, $\bar{y}1$, y2 and $\bar{y}2$ will be present while interconnections Y1, $\overline{Y1}$, Y2 and $\overline{Y2}$ will be removed.

Considering now the situation when the slave storage registers $y_1, y_2$ have the values 0,0 stored therein resulting from application of a high CLK signal to the gates of devices 60 (Clock interval 1 of FIG. 1). These inputs will immediately apply outputs to output NOR gates 51-54. To the extent CLK is high, gates 52,54 provide a zero output and the extent $\bar{y}_1$ and $\bar{y}_2$ are high, gates 51,53 provide a zero output. Similarly, as long as $\overline{SET}$ is high ($SET=0$) output logic NOR gates 56,57 provide zero output. As shown in FIG. 4, as long as $SET=0$, the circuit remains in the $S_{00}$ state.

When $\overline{CLK}$ goes high and CLK goes low (clock interval 2 of FIG. 1), the outputs of output logic NOR gates 56,57 are latched into master storage registers $Y_1, Y_2$. With the values, 0,0, latched-in, the only values which change on the output NOR gates 51-54 are CLK and $\overline{CLK}$. With $\overline{CLK}$ high, the outputs on output NOR gates 51,53 are zero and, with $y_1$ and $y_2$ high, the outputs on output NOR gates are also zero. As previously indicated, with $\overline{SET}$ high, output logic NOR gates 56,57 still provide zero outputs.

When CLK goes high again and $\overline{CLK}$ goes low (clock interval 3 of FIG. 1), the same events occur as during the first interval when CLK was high. Thus, the outputs are zero on output NOR gates 51-54 and on output logic NOR gates 56,57.

During the next clock interval, $\overline{CLR}$ is high and CLK is low (clock interval 4 of FIG. 1). The outputs of slave registers $y_1, y_2$ remain the same and, as a result, the outputs of output NOR gates 51-54 remain zero. If, during this clock interval $\overline{SET}$ is caused to go low, the output logic NOR gates 56,57 have zero signals applied to their inputs. During this interval, $\bar{y}_1$ and $\bar{y}_2$ are high, so the outputs of input NOR gates 58,59 are low. These outputs, in conjunction with the low inputs already present on gates 56,57 due to $\overline{SET}$ being low, provide the outputs 1,1 on output logic NOR gates 56,57, which are now latched into master storage registers $Y_1,Y_2$. During the next interval, CLK goes high and $\overline{CLK}$ goes low (clock interval 5 of FIG. 1), and the 1,1 outputs from master storage registers $Y_1,Y_2$ are latched into slave storage registers $y_1,y_2$ via devices 60. Since CLK is high, the outputs on output NOR gates 52,54 are zero and since $y_1$ and $y_2$ are high, the outputs on output NOR gates 51,53 are also zero. With SET high ($\overline{SET}=0$) and PROC low ($\overline{PROC}$ high), the inputs to input logic NOR gate 58 are $\bar{y}_1$ low and $y_2$ high, providing an output of zero on gate 58. With the inputs to input logic gate PROC high, and $\bar{y}_2$ low, the output on gate 59 is zero. These outputs in conjunction with SET high, provide the outputs 1,1 on output logic NOR gates 56,57 respectively.

Now, when $\overline{CLK}$ goes high and CLK goes low (clock interval 6 of FIG. 1), the outputs 1,1 from gates 56,57 are latched into master storage registers $Y_1$, $Y_2$. With $\overline{CLK}$ high, output NOR gates 51,53 provide zero outputs and, with $y_2$ high, output NOR gate 52 also provides a zero output. However, since CLK is low and $y_2$ is also low, these signals which are inputs to output NOR gate 54 provide a high $\phi_4$ output on that gate. With SET high, ($\overline{SET}=0$) and $\overline{PROC}$ high (PROC=0), since $\bar{y}_1$ and $\bar{y}_2$ are low and $y_2$ is high, the outputs on gates 56,57 are both one.

From the previous discussion, it should now be clear that the desired outputs can be obtained when combined circuit states are considered during a combined clock interval. It should also be clear that during the combined clock intervals 5,6, that a circuit output state of zero has been achieved during clock interval 5 and a circuit output state of $\phi_4$ has been achieved during clock interval 6 resulting in a combined state of $S_{04}$ *during the combined clock interval 5,6.*

It should be noted, that in order to achieve an output during clock interval 6, that the input 1,1 was present at the outputs of NOR logic gates 56,57 at the end of clock interval 4 in response to the application of a SET=1 signal applied at the beginning of clock interval 4.

In order to achieve a zero output on all the outputs $\phi_1$-$\phi_4$ and a $\phi_4$ output only during clock intervals 7-8, SET must be high during the clock intervals 5,6 and PROC must be low during clock interval 6. The circuit, under such circumstances during the clock intervals 7,8 is still in the $S_{04}$ state.

To cause circuit 50 to enter the $S_{12}$ state, the inputs 1,0 must appear at the inputs to the master storage registers $Y_1,Y_2$ during clock interval 8 and both SET and PROC must be high. Similarly, to cause circuit 50 to enter the $S_{34}$ state, the inputs 0,1 must appear at the inputs to the master storage registers $Y_1,Y_2$ during clock interval 10 and SET must be high. Finally, to achieve the $S_{04}$ state, the inputs 1,1 must appear at the inputs to the master storage registers $Y_1,Y_2$ during clock interval 16.

In FIG. 5, a plurality of lines labeled Y1, $\overline{Y}$1, Y2 and $\overline{Y}$2 are shown as interconnections bypassing slave storage registers $y_1,y_2$. The interconnections are shown extending from the true and complement outputs of master storage registers $Y_1,Y_2$ to connect up with interconnections which extend from the true and complement outputs of the slave storage registers $y_1,y_2$. p A plurality of dashed lines labeled y1, $\bar{y}$1, y2 and $\bar{y}$2 are shown in FIG. 5 connected to the true and complement outputs of slave storage registers $y_1,y_2$. In one mode of operation, the interconnections Y1, $\overline{Y}$1, Y2 and $\overline{Y}$2 are not present while the dashed line interconnections y1, $\bar{y}$1, y2 and $\bar{y}$2 are present. In another preferred embodiment, interconnections Y1, $\overline{Y}$1, Y2 and $\overline{Y}$2 are present while dashed line interconnections y1, $\bar{y}$1, y2 and $\bar{y}$2 are not present. By eliminating the dashed line interconnections, when signals are gated into master storage registers $Y_1,Y_2$, their true and complement outputs are applied directly to output NOR gates 51,53, for example, so that inputs to these gates arrive during an interval when $\overline{CLK}$ is high. Because $\overline{CLK}$ is high, the outputs of gates 51,53 will always be zero and transitions from one to zero or zero to one on the other inputs cannot produce a condition where, in the course of their transitions, all zeros would appear on the inputs producing a spurious one output at the outputs of NOR gates 51,53. Similarly, when CLK is high, and inputs are being provided to output NOR gates 52,54 from slave storage registers $y_1,y_2$ since CLK is high, the other inputs to gates 52,54 may undergo transitions without the danger of producing a spurious output or "spike" which would appear as a high output to circuits which gates 52,54 control. Without bypassing slave storage registers and leaving interconnections yl, $\bar{y}$1, y2 and $\bar{y}$2 in place, a pair of output NOR gates 51,53 would always be in a state where CLK is low and the other inputs undergo a transition. Under such circumstances, all the inputs to a gate may be momentarily zero, producing the aforementioned spurious output or "spike". Eliminating the dashed line interconnections y1, $\bar{y}$1, y2, $\bar{y}$2 and adding interconnections Y1, $\overline{Y}$1, Y2 and $\overline{Y}$2, effectively prevents spurious outputs without otherwise affecting the operation of the circuit.

Having thus described my invention, what I claim as new and desire to secure by Letters Patent is:

1. A circuit for generating at least a single output during each interval of a clock wherein the number of storage elements and their associated combinatorial logic are reduced to a minimum comprising:
   means for storing in binary form all possible states of said circuit which occur during successive adjacent pairs of said intervals of said clock, said means for storing being the minimum number of storage elements required to store the states of said circuit, which includes a plurality of output interconnections to provide at said output interconnections output gate conditioning signals representing one of said states of said circuit and logic gate conditioning signals,
   a plurality of clocked output gates which provide said at least a single output during each interval of said clock, each of said plurality of output gates being connected to said clock and to said means for storing via said plurality of output interconnections, and
   a combinatorial logic circuit for logically combining therein logic inputs and signals from said means for storing to deliver at the output thereof signals representing another of said states of said circuit, connected to said means for storing.

2. A circuit according to claim 1 wherein said means for storing includes a pair of master storage registers and a pair of slave storage registers, a first pair of clocked switchable devices connected to the respective inputs of said pair of master storage registers and a second pair of clocked switchable devices connected to the respective inputs of said pair of slave storage registers, a pair of outputs from said pair of said master storage registers being connected to said second pair of clocked switchable devices, said signals of said combinatorial logic circuit being connected to said first pair of clocked switchable devices and the outputs of said pair of slave storage registers being connected to inputs of said combinatorial logic circuit and to said plurality of output gates.

3. A circuit according to claim 1 wherein each of said output gates is a NOR gate.

4. A circuit according to claim 1 wherein said plurality of output gates include first and second groups of said output gates each said output gate having a plurality of inputs, one input to each of said first group being connected to a first clock signal and one input to each of said second group being connected to a second clock signal, the remainder of said plurality of inputs of each of said output gates being connected to said means for storing via said plurality of output interconnections.

5. A circuit according to claim 1 further including means for applying said logic inputs to said combinatorial logic circuit.

6. A circuit according to claim 5 wherein said means for applying said logic inputs includes first and second pulsed sources connected to said combinatorial logic circuit.

7. A circuit according to claim 1 further including means for applying an enabling clock signal during one of each of said successive adjacent pairs of said intervals of said clock to a first group of said plurality of output gates and for applying an enabling clock signal during the other of each of said successive adjacent pairs of said intervals of said clock to a second group of said plurality of output gates.

8. A circuit according to claim 7 wherein said means for applying an enabling clock signal includes a first source of clock pulses operable during said one of each of said successive adjacent pairs of intervals of said clock and a second source of clock pulses operable during said other of each of said successive adjacent pairs of intervals of said clock.

9. A circuit according to claim 1 wherein said combinatorial logic circuit includes a pair of output logic gates and a pair of input logic gates, the output of each of said pair of input logic gates being connected to a respective input of said pair of output logic gates, a pair of inputs of one of said pair of input logic gates being connected to said means for storing via a pair of said plurality of output interconnections, one of said inputs of the other of said pair of input logic gates being connected to said means for storing via another of said plurality of output interconnections, the remaining input of said other of said pair of input logic gates being connected to a first source of input signals, and a second source of input signals connected to another input of each of said output logic gates.

10. A circuit according to claim 9 wherein said input and output logic gates are NOR gates.

11. A circuit according to claim 9 wherein said output gates are NOR gates.

12. A circuit according to claim 1 further including means for disabling a first group of said plurality of output gates during a first and alternate succeeding intervals of said clock while simultaneously applying output gate conditioning signals from said means for storing which are to be present when said first group of said output gates is enabled during a second and alternate succeeding intervals of said clock.

13. A circuit according to claim 12 further including means for applying input signals to said combinatorial logic circuit.

14. A circuit according to claim 12 further including means for enabling a second group of said plurality of output gates during said second and alternate succeeding intervals.

15. A circuit according to claim 12 wherein said means for disabling and simultaneously applying includes a source of disabling clock pulses connected to an input of each of said first group of output gates during said first interval and means for applying the true and complement of said signals of said combinatorial logic circuit in binary form from said means for storing to said first group of output gates via said plurality of output interconnections.

16. A circuit according to claim 12 wherein said means for storing includes a pair of master storage registers and a pair of slave storage registers, a first pair of clocked switchable devices connected to the respective inputs of said pair of master storage registers and a second pair of clocked switchable devices connected to the respective inputs of said pair of slave storage registers, outputs of said pair of master storage registers being connected to said second pair of clocked switchable devices, said signals of said combinatorial logic circuit being connected to said first pair of clocked switchable devices and the outputs of said slave storage register being connected to said inputs of said combinatorial logic circuit and to said plurality of output gates via said plurality of output interconnections.

17. A circuit according to claim 12 wherein said combinatorial logic circuit includes a pair of output logic gates and a pair of input logic gates, the output of each of said pair of input logic gates being connected to a respective input of said pair of output logic gates, a pair of said inputs of one of said pair of input logic gates being connected to said means for storing via a pair of said plurality of output interconnections, one of said inputs of the other of said pair of input logic gates being connected to said means for storing via another of said plurality of output interconnections, another input of said other of said pair of input logic gates being connected to a first source of input signals, and a second source of input signals connected to another input of each of said output logic gates.

18. A circuit according to claim 12 wherein said plurality of output gates include first and second groups of said output gates each said output gate having a plurality of inputs, one input to each of said first group being connected to a first clock signal and one input to each of said second group being connected to a second clock signal, the remainder of said plurality of inputs of each of said output gates being connected to said means for storing via said plurality of output interconnections.

* * * * *